United States Patent [19]

Tajchman et al.

[11] 3,723,907

[45] Mar. 27, 1973

[54] SYNC OSCILLATOR

[75] Inventors: Edwin J. Tajchman, Denver; James D. Brandt, Lakewood, both of Colo.

[73] Assignee: Computer Image Corporation, Denver, Colo.

[22] Filed: Aug. 24, 1970

[21] Appl. No.: 66,464

[52] U.S. Cl. ..................331/143, 307/228, 328/127, 328/181, 331/111

[51] Int. Cl. ..............................................H03k 3/02

[58] Field of Search ......331/111, 143; 328/127, 181; 307/228

[56] References Cited

UNITED STATES PATENTS

| | | | |
|---|---|---|---|
| 3,047,820 | 7/1962 | Lawton | 331/143 |
| 3,256,426 | 6/1966 | Roth et al. | 327/127 |
| 3,262,069 | 7/1966 | Stella | 331/57 |
| 3,302,132 | 1/1967 | Karklys | 331/145 |
| 3,309,507 | 3/1967 | Schlein | 307/290 |
| 3,328,724 | 6/1967 | Way | 307/235 |
| 3,373,377 | 3/1968 | Townsend | 331/111 |
| 3,617,769 | 11/1971 | Hanson | 328/127 |

*Primary Examiner*—John Kominski

*Attorney*—Rogers, Ezell, Eilers & Robbins

[57] ABSTRACT

An oscillator for generating a triangular waveform by alternately switching positive and negative DC signals to the input of an integrator in response to output signals from a flip-flop, the flip-flop being responsive to selective peak values of the integrator output, and means for synchronizing the oscillator to begin oscillating in response to a sync pulse in any one of several phases.

11 Claims, 2 Drawing Figures

INVENTORS:
EDWIN J. TAJCHMAN,
JAMES D. BRANDT,
BY Rogers, Ezell, Eilers & Robbins
ATTORNEYS

SYNC OSCILLATOR

BACKGROUND OF THE INVENTION

Certain applications require the use of a triangular wave oscillator which can be synchronized with a sync pulse to begin oscillating in any one of several phase conditions. For example, such an oscillator is very useful in conjunction with Lee Harrison, III et al. co-pending patent application, Ser. No. 882,125 entitled "Computer Animation Generating System." As an example of its use in conjunction with the invention of the co-pending application, the horizontal reset pulse generated by the circuit shown in FIG. 1 of that application is used as a sync pulse to sync the oscillator in a given phase at the beginning of each horizontal line of the raster. With a horizontal sync rate of 28.8 KHz and an oscillator frequency of 57.6KHz there are two oscillator cycles generated for each horizontal line of the raster with the oscillator signal re-synced at the start of each line to remain exactly in the same phase. The sync oscillator signal is added to the vertical component of the raster causing the raster to bend in a shape corresponding to the shape of the oscillator waveform. This raster bending technique is very useful in producing animation. The amplitude of the oscillator signal determines the amplitude of the bend, and the frequency of the oscillator signal determines the number of bends.

As another example, the vertical reset signal of the co-pending application is used as a sync signal to synchronize the oscillator signal at the beginning of each frame. The synchronized oscillator signal is used as an X or Y animation signal for animating the scene.

In these and other applications of the oscillator of this invention it is desirable to have means for synchronizing the oscillator signal to any of several phase conditions, and to have the capability of selecting an amplitude from a wide range of amplitudes and a frequency from a wide range of frequencies. This invention provides such an oscillator.

SUMMARY OF THE INVENTION

This invention includes means for generating positive and negative DC voltages which are alternately switched to the input of an integrator. With a positive DC voltage at the input of the integrator the integrator output is a ramp function having a slope of one polarity and with the negative DC voltage at the input of the integrator, the integrator output is a ramp function having a slope of opposite polarity. Means are provided for alternately opening and closing the switches to alternately generate at the output of the integrator positive and negative sloping ramp functions which combine to form a triangular wave. The frequency of the triangular wave is proportional to the magnitude of the DC voltage values applied at the input of the integrator. The oscillator also includes means for adjusting the amplitude of the oscillator signal in accordance with the opening and closing frequency of the switches. Means are also provided for synchronizing the oscillator waveform in response to a sync pulse to begin oscillating in any one of several phase conditions. Driving means are provided to insure that these phase conditions can be met during the time duration of the sync pulse regardless of the position on the output waveform when the sync pulse occurs.

DETAILED DESCRIPTION OF THE PREFERRED EMBODIMENT

Figure 1:
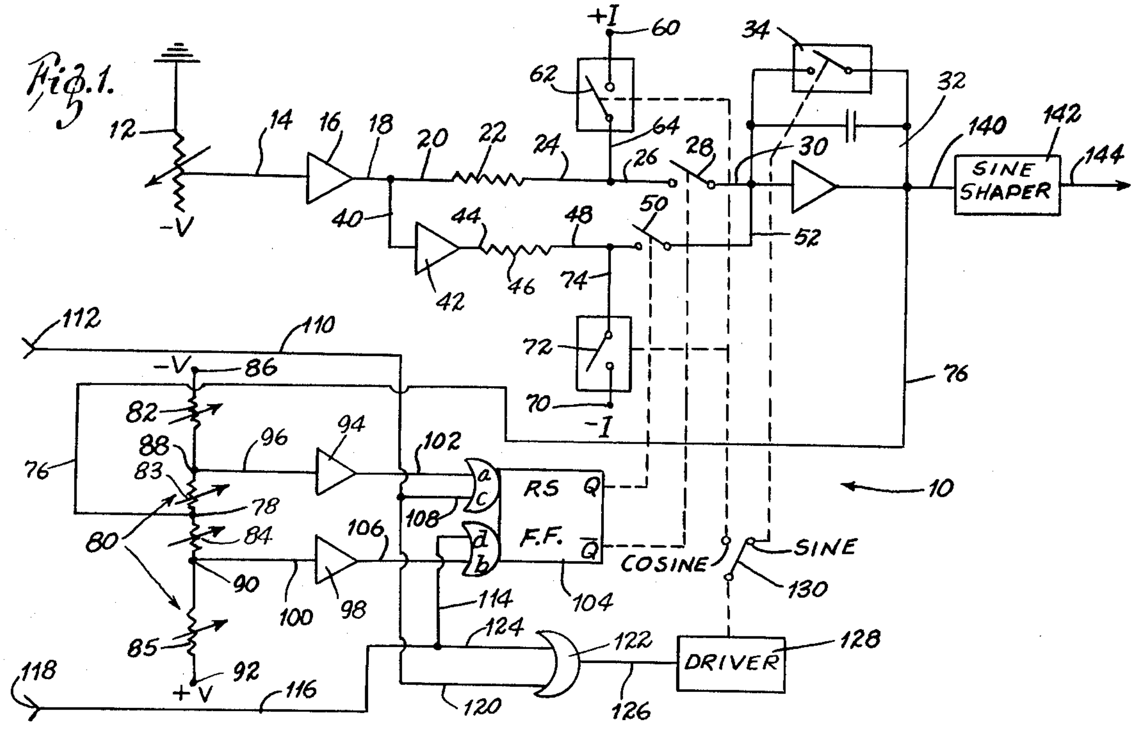
FIG. 1 is a schematic drawing of the oscillator of this invention.

In FIG. 1 there is shown the oscillator circuit 10 of this invention. A negative DC input set by a potentiometer 12 is fed through a conductor 14 to the input of an inverter 16. The output from the inverter 16, which is a positive DC voltage, is fed through a conductor 18, a conductor 20, a resistor 22, a conductor 24, and a conductor 26 to one side of an electronic switch 28. The other side of the electronic switch 28 is connected by a conductor 30 to the input of an integrator 32. In parallel with the integrator 32 is an electronic switch 34. The positive DC voltage on the conductor 18 is also fed through a conductor 40 to the input of an inverter 42. The output of the inverter 42, which is a negative DC voltage, is fed through a conductor 44, a resistor 46, and a conductor 48 to one side of an electronic switch 50. The other side of the electronic switch 50 is connected by a conductor 52 to the input of the integrator 32.

A positive current source 60 is connected through an electronic switch 62 and a conductor 64 to the conductor 24, and a negative current source 70 is connected through an electronic switch 72 and a conductor 74 to the conductor 48. When the electronic switch 28 is closed it is the current in the conductor 24, the level of which is determined by the ratio of the DC voltage set by the potentiometer 12 and the resistor 22, that normally charges the capacitor of the integrator 32. However, when the electronic switch 62 is closed the charging current is the sum of the currents in conductors 24 and 64. When the electronic switch 50 is closed it is the current on the conductor 48, the level of which is set by the ratio of the voltage set by the potentiometer 12 and the resistor 46, which normally charges the capacitor of the integrator 32. However, with the electronic switch 72 closed the charging current is the sum of the currents in the conductors 48 and 74. The values of the current sources 60 and 70 are such that the currents in the conductors 64 and 74 are much greater than those supplied by the conductors 24 and 48.

The output from the integrator 32 is connected by a conductor 76 to the center junction 78 of a resistance network 80 which is shown having four variable resistors 82, 83, 84, and 85 connected in series. One side of the resistor 82 is connected to a negative DC reference voltage 86. Between the resistors 82 and 83 is formed a junction 88, between the resistors 83 and 84 is formed the junction 78, and between the resistors 84 and 85 is formed a junction 90. The other side of the resistor 85 is connected to a positive DC reference voltage 92. The input of a zero level detector 94 is connected by a conductor 96 to the junction 88 between the resistors 82 and 83. The input of a zero level detector 98 is connected by a conductor 100 to the junction 90 between the resistors 84 and 85. Each of the zero level detectors 94 and 98 produces at its output a negative level whenever its input is zero. The output of the zero level detector 94 is connected by a conductor 102 to the input *a* of the RS flip-flop 104. The output of the zero level detector 98 is connected by a conductor 106 to the *b* input of the RS flip-flop 104. The RS flip-flop 104 also has input *c* connected by a conductor 108 and a conductor 110 to an appropriate sync signal input 112, and an input *d* connected by a conductor 114 and a conductor 116 to an appropriate sync signal input 118. The RS flip-flop 104 has outputs Q and $\overline{Q}$. A signal at the Q output opens the switch 50 and a signal at the $\overline{Q}$ output opens the switch 28 as sown by the dashed lines on the figure.

The sync signal input 112 is also connected by the conductor 120 and a conductor 120 to one input of an OR gate 122. The sync signal input 118 is also connected by the conductor 116 and a conductor 124 to another input of the OR gate 122. The output of the OR gate 122 is connected by a conductor 126 to the driver 128, the output of which is connected to one side of a mechanical switch 130 having a sine position and a cosine position. The cosine terminal of the switch 130 is connected to operate the electronic switches 62 and 72, and the sine terminal of the mechanical switch 130 is connected to operate the electronic switch 34 is shown by the dashed lines of the figure.

The output of the integrator 32 is also connected by a conductor 140 to a sine shaper network 142 which converts a triangular wave to a sine wave, the resultant sine wave appearing on an output conductor 144.

OPERATION

The operation of the circuit will be explained in the free-running mode and in the sync mode.

Free-Running Mode

In the free-running mode there are no sync pulses applied to either the sync inputs 112 or 118, hence, there are no signals at the inputs of the OR gate 122, and, therefore, no signal to the driver 128. With the driver 128 deactivated, the switches 62, 72, and 34 are open.

To establish an initial condition, assume that the switch 28 is closed and the switch 50 is open. The input potentiometer is set to a negative DC voltage which is fed through the conductor 14 to the input of the inverter 16 which inverts the voltage to a positive DC voltage. With the electronic switch 28 closed the positive DC voltage is fed into the integrator 32 which integrates the positive DC voltage to produce at its output a negative ramp function, the slope of which depends on the DC value set by the potentiometer 12. The negative ramp function at the output of the integrator 32 is fed through the conductor 76 to the junction 78 of the resistance network 80. With the positive DC voltage 92 and the variable resistors 84 and 85 at selective values, the negative ramp function at the junction 78 will eventually reach a value to cause the junction 90 to be at zero voltage. With the junction 90 at zero voltage, and, hence, the input to the zero level detector 98, the zero level detector 98 generates a negative level at its output which is fed to the input *b* of the RS flip-flop 104, causing the RS flip-flop 104 to change state with its Q output at a level to close the switch 50 and its $\overline{Q}$ output at a level to open the switch 28. Opening the switch 28 removes the positive DC voltage input to the integrator 32, while closing the switch 50 applies the negative DC voltage level at the output of the inverter 42 to the integrator 32. The negative DC input produces at the output of the integrator 32 a positive ramp function which is fed through the conductor 76 to the junction 78. With the negative DC voltage 86 and variable resistors 82 and 83 set to selected values, the positive ramp function at the junction 78 will reach a value to produce at the junction 88 a zero voltage level. With the junction 88 at a zero voltage the zero voltage detector 94 generates a negative level at its output which is fed to the input *a* of the RS flip-flop 104 causing the RS flip-flop 104 to change state with its Q output going to a level to open the switch 50 and its $\overline{Q}$ output going to a level to close the switch 28. The above operation will repeat in the free-running mode to generate at the output of the integrator 32 a continuous triangular wave of a frequency proportional to the potentiometer 12 input voltage and of an amplitude set by the DC reference voltages 86 and 92. The triangular wave on the conductor 140 is fed into the sine shaper 142 to produce at the output conductor 144 a continuous sine wave.

Sync Mode

The sync mode operates to synchronize the output waveform from the oscillator to a sync signal. The waveform can be synced to any one of four phases: positive going sine wave, negative going sine wave, positive going cosine wave, and negative going cosine wave.

Figure 2:
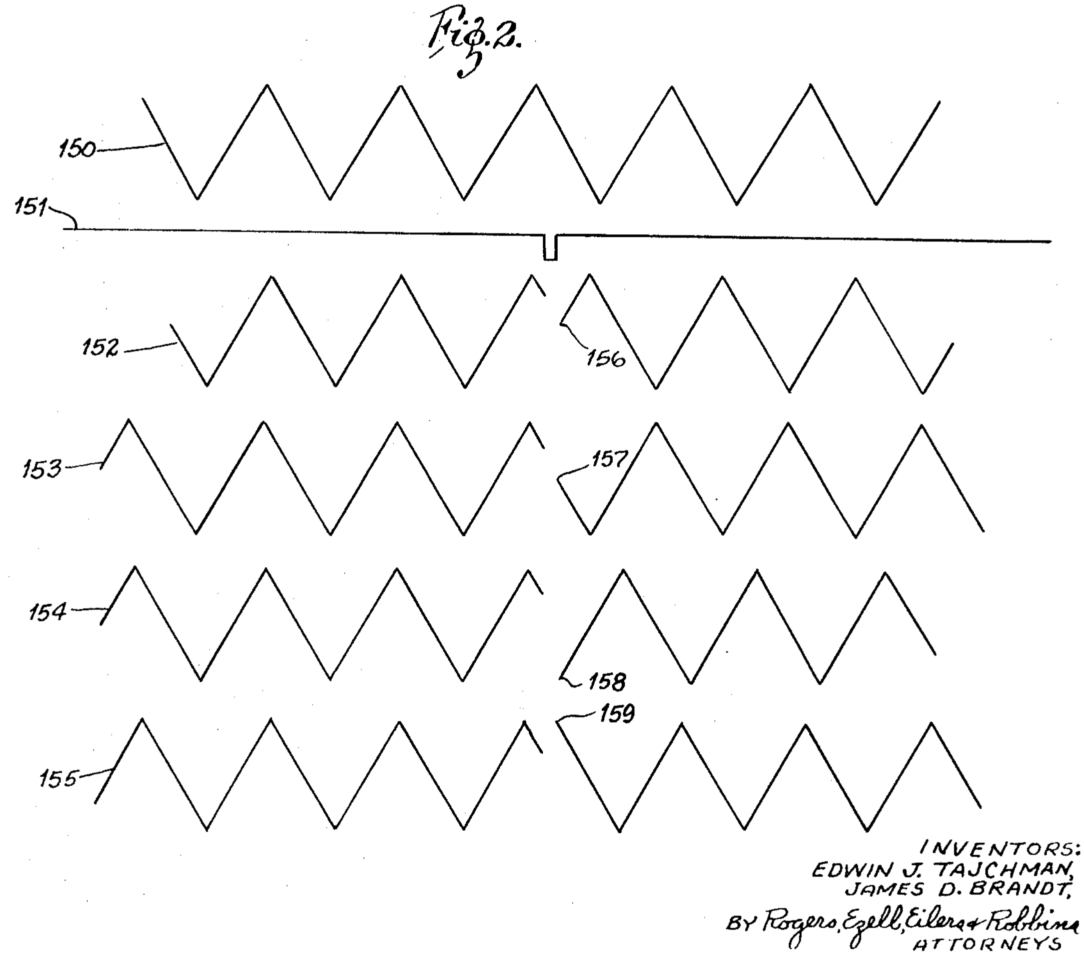
FIG. 2 is a drawing of waveforms used in describing the synchronizing operations of this invention.

Referring to FIG. 2, there is shown a waveform 150 which is the triangular output waveform on the conductor 140 in the free-running mode. The waveform 151 is a sync signal having a pulse occurring at a time in relation to the triangular waveform 150 as shown in the figure. The waveform 152 is shown synchronized in the positive going sine phase (starting at zero voltage) at the trailing edge of the sync pulse, the waveform 153 is shown synchronized in the negative going sine phase (starting at zero voltage) at the trailing edge of the sync pulse, the waveform 154 is shown synchronized in the positive going cosine phase (starting at a negative peak) at the trailing edge of the sync pulse, and the waveform 155 is shown synchronized in the negative going cosine phase (starting at a positive peak) at the trailing edge of the sync pulse.

To synchronize the wave 150 to the sync signal in the positive going sine phase the sync signal 151 is applied to the sync input 118, and the switch 130 is placed in the sine position. As can be seen from the drawing of the waveforms 150–155, at the time the sync pulse occurs the free-running triangular wave 150, has just passed a positive peak and begun a negative slope. With the waveform 150 in a negative slope the electronic switch 28 is closed and the electronic switch 50 is open. The sync pulse at the input 118 is fed through the conductors 116 and 114 to the input *d* of the RS flip-flop 104 causing the flip-flop 104 to change state with the signal at the Q output causing the switch 50 to close and the signal at the Q output causing the switch 28 to open. The sync pulse on the conductor 116 is also fed through the conductor 124, the OR gate 122, the conductor 126, the driver 128 and the switch 130 to close the electronic switch 34. With the electronic switch 34 closed, the integrator 32 is shorted producing a zero voltage at its output. With the output of the integrator 32 at zero voltage there is no signal on the conductor 76 to further affect the state of the flip-flop 104. At the end of the sync pulse the electronic switch 34 opens allowing the integrator 32 to function. With the switch 28 open and the switch 50 closed the integrator 32 will produce a positive sloping signal at its output beginning at a point 156 of zero voltage (see waveform 152). The oscillator will continue in a free-running mode as heretofore described until the next sync pulse occurs.

To synchronize the waveform 150 to a negative going sine phase the sync signal is applied at the input 112. Because the waveform is in a negative slope at the time the sync pulse is applied, the electronic switch 28 is closed and the electronic switch 50 is open. The mechanical switch 130 is placed in the sine position. The sync pulse is fed through the conductors 110 and 108 to the input *c* of the RS flip-flop 104. The signal at the input *c* of the RS flip-flop 104 produces a signal at the Q output to open the switch 50 and a signal at the $\overline{Q}$ output to close the switch 28. Since the switch 50 is already open and the switch 28 already closed there is no change in the condition of these switches. The sync signal on the conductor 110 is also fed through the conductor 120, the OR gate 122, the conductor 126, the driver 128, and the switch 130 to close the electronic switch 34. With the electronic switch 34 closed, the integrator 32 is shorted producing a zero voltage at its output. With a zero voltage at the output of the integrator 32 there is no signal on the conductor 76 to further affect the state of the RS flip-flop 104. At the conclusion of the sync pulse the electronic switch 34 opens, allowing the integrator 32 to operate. With the switch 28 closed and the switch 50 opened, the positive DC voltage at the input of the integrator 32 causes the integrator 32 to generate a negative sloping function beginning at a point 157 of zero voltage (see the waveform 153). The oscillator continues in the free-running mode as heretofore described until the next sync pulse occurs.

To synchronize the waveform 150 in a positive going cosine phase the switch 130 is placed in the cosine position and the sync signal 151 is applied to the input 112. Again referring to FIG. 2 it is noted that at the time the sync pulse is applied the waveform 150 is in a negative slope so that the electronic switch 28 is closed and the electronic switch 50 is open. The sync signal 151 is fed through the conductors 108 and 110 to the input *c* of the RS flip-flop 104, producing a signal at the Q output to hold the switch 50 open and a signal at the $\overline{Q}$ output to hold the switch 28 closed. The sync signal on the conductor 110 is also fed through the conductor 120, the OR gate 122, the conductor 126, the driver 128, and the switch 130 to close the switch 62. With the switch 62 closed the current source 60 which is positive DC current of value considerably greater than the value of the current in conductor 24, which is determined by the ratio of the absolute value of the potentiometer input voltage to the resistor 22, is applied to the input of the integrator 32 to produce at the output of the integrator 32 a negative ramp function of considerably greater slope than the function produced by the potentiometer 12 input voltage. The value of the DC current 64 is sufficiently great to drive the output of the integrator 32 to the negative peak value of the triangular waveform within the time duration of the sync pulse. The negative ramp signal is fed through the conductor 76 to the junction 78 of the resistance network 80. When the signal at the junction 78 is equal to the negative peak value of the triangular wave, a zero voltage level appears at the junction 90 causing the zero level detector 98 to produce at its output a negative level which is fed through the conductor 106 to the input *b* of the RS flip-flop 104. With trigger pulses at both inputs *c* and *b* the signal at the Q output will hold the switch 50 open, and a signal is produced at the $\overline{Q}$ output to open the switch 28. At the conclusion of the sync pulse the Q output goes to a level to close the switch 50. Simultaneously, the output signal from the driver 128 is removed to open the electronic switch 62. With the switch 28 open and the switch 50 closed the output of the integrator 32 is a positive sloping signal starting at a negative peak voltage 158 of the waveform 150 (see the waveform 154). The oscillator will continue to operate in a free-running mode as heretofore described until the next sync pulse occurs.

To synchronize the waveform 150 in a negative sloping cosine phase the switch 130 is placed in the cosine position and the sync signal 151 is applied to the input 118. Again referring to FIG. 2, it is seen that when the sync pulse occurs the waveform 150 is in a negative slope so that the switch 28 is closed and the switch 50 is open. The sync signal applied at the input 118 is fed through the conductors 116 and 114 to the input *d* of the RS flip-flop 104 producing at the $\overline{Q}$ output a signal to open the switch 28 and a signal at the Q output to close the switch 50. The sync signal on the conductor 116 is also fed through the conductor 124, the OR gate 122, the conductor 126, the driver 128, and the switch 130 to close the electronic switch 72. With the electronic switches 50 and 72 closed the negative DC current source 70, the value of which is considerably greater than the value of the current in conductor 48 which is determined by the ratio of the absolute value of the potentiometer 12 input voltage to the resistor 46, is applied to the input of the integrator 32 producing at the output of the integrator 32 a positive sloping signal having a slope considerably greater than the positive slope of the waveform 150. The current source 74 is of sufficient value to produce a positive slope at the output of the integrator 32 which will drive the waveform to a positive peak value within the time duration of the sync pulse. The positive sloping signal at the output of the integrator 32 is fed through the conductor 76 to the junction 78 of the resistance network 80. When the junction 78 reaches a positive peak value a zero level appears at the junction 88 to cause the zero level detector 94 to produce a negative level which is fed to the input *a* of the RS flip-flop 104 producing a signal at the Q output to open the electronic switch 50. Because the sync signal is being applied to the input *b* of the flip-flop 104, the signal at the $\overline{Q}$ output remains unchanged to maintain the electronic switch 28 open. At the conclusion of the sync pulse the $\overline{Q}$ output of the RS flip-flop 104 changes state to close the electronic switch 28. Simultaneously, the output signal from the driver 128 is removed to open the electronic switch 72. With the electronic switch 28 closed and electronic switch 50 open, the DC voltage from the potentiometer 12 input is fed into the input of the integrator 32 to produce at the output of the integrator 32 a negative going ramp starting at a positive peak voltage 159 of the waveform 150 (see the waveform 155). The oscillator will continue to operate in the free-running mode as heretofore described until the next sync pulse occurs.

Various changes and modifications may be made within this invention as will be readily apparent to those skilled in the art. Such changes and modifications are within the scope and teaching of this invention as defined by the claims appended hereto.

What is claimed is:

1. An oscillator which is reset in response to a sync pulse to begin oscillating in any of several phase variations which include a sine wave going positive, a sine wave going negative, a cosine wave going positive from a negative peak, and a cosine wave going negative from a positive peak, comprising an integrator means, means for alternately applying positive and negative DC signals to the input of the integrator means thereby producing a triangular wave at its output, means for selecting the phase in which the oscillator is to begin oscillating in response to the sync pulse, means for driving the output of the integrator to zero in response to the sync pulse when a sine phase is selected, means for driving the output of the integrator to a peak value in response to the sync pulse when a cosine phase is selected, means for applying the appropriate DC signal to the input of the integrator means to produce at the integrator output a positive going ramp at the conclusion of the sync pulse when a positive going phase is selected, and means for applying the appropriate DC signal to the input of the integrator means to produce at the output of the integrator a negative going ramp at the conclusion of the sync pulse when a negative going phase is selected.

2. The oscillator of claim 1 including switch means for switching the DC signals to the input of the integrator means.

3. The oscillator of claim 2 wherein the alternately applying means includes a flip-flop, the switch means being responsive to the signal at one output of the flip-flop to apply one of the DC signals to the input of the integrator, and the switch means being responsive to the signal at another output of the flip-flop to apply the other DC signal to the input of the integrator.

4. The oscillator of claim 3 further comprising means for selecting the amplitude of the integrator output signal which last-named means includes means for comparing the positive ramp signal from the integrator output with a first reference voltage, means for triggering the flip-flop to switch a DC signal of one polarity to the input of the integrator when the positive ramp signals and first reference voltage compare in predetermined correspondence, means for comparing the negative ramp signals from the integrator output with a second reference voltage, and means for triggering the flip-flop to switch the DC signal of opposite polarity to the input of the integrator when the negative ramp signals and second reference voltage compare in predetermined correspondence.

5. The oscillator of claim 1 wherein the second driving means further includes means for driving the output of the integrator to a peak value within the duration of the sync pulse in response to the sync pulse regardless of the slope of the integrator output signal before the sync pulse occurs.

6. The oscillator of claim 5 wherein the last-named driving means further comprises additional positive and negative DC signals of substantially greater amplitude than those alternately applied to the input of the integrator means, and means for applying the appropriate one of the substantially greater DC signals to the input of the integrator means for the duration of the sync pulse and in response to it in accordance with the polarity of the phase selected.

7. A method of generating a triangular waveform which is reset in response to a sync pulse to begin oscillating in one of several phase variations which include a sine phase and a cosine phase, comprising the steps of alternately applying positive and negative DC signals to the input of an integrator means thereby producing a triangular wave at its output, selecting the phase in which the oscillator is to begin oscillating in response to the sync pulse from either a sine phase or cosine phase, driving the output of the integrator to zero in response to the sync pulse when a sine phase is selected, and driving the output of the integrator to a peak value in response to the sync pulse when a cosine phase is selected.

8. The method of claim 7 wherein the step of driving the output of the integrator to zero further comprises shorting the integrator input to its output when a sine phase is selected.

9. The method of claim 7 wherein the second driving step further includes driving the output of the integrator to a peak value within the duration of the sync pulse in response to the sync pulse regardless of the slope of the integrator output signal before the sync pulse occurs.

10. The method of claim 9 further comprising the step of applying a DC signal to the input of the integrator means, which DC signal is of substantially greater amplitude than those alternately applied to the input of the integrator means, for the duration of the sync pulse and in response to it when a cosine phase is selected.

11. A method of generating a triangular waveform which is reset in response to a sync pulse to begin oscillating in any of several phase variations which include a positive going phase and a negative going phase, comprising the steps of alternately applying positive and negative DC signals to the input of an integrator means thereby producing a triangular wave at its output, selecting the phase in which the oscillator is to begin oscillating in response to the sync pulse from either a positive going phase or a negative going phase, applying the DC signal of appropriate polarity to the input of the integrator means to produce at the integrator output a positive going ramp at the conclusion of the sync pulse when a positive going phase is selected, and applying the DC signal of opposite polarity to the input of the integrator means to produce at the output of the integrator a negative going ramp at the conclusion of the sync pulse when a negative going phase is selected.

* * * * *